(12) United States Patent
Lesher

(10) Patent No.: US 6,396,759 B1
(45) Date of Patent: May 28, 2002

(54) SEMICONDUCTOR DEVICE WITH TEST FUSE LINKS, AND METHOD OF USING THE TEST FUSE LINKS

(75) Inventor: Mark K. Lesher, Mohrsville, PA (US)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/561,375

(22) Filed: Apr. 28, 2000

(51) Int. Cl.[7] .................................................. G11C 7/00
(52) U.S. Cl. ...................................... 365/225.7; 365/201
(58) Field of Search ............................... 365/225.7, 201, 365/96

(56) References Cited

U.S. PATENT DOCUMENTS

| | | | | |
|---|---|---|---|---|
| 5,396,130 A | * | 3/1995 | Galbraith et al. ............ 326/102 |
| 5,412,594 A | * | 5/1995 | Moyal et al. .................. 365/96 |
| 5,838,076 A | * | 11/1998 | Zarrabian et al. ........... 307/115 |
| 5,973,977 A | * | 10/1999 | Boyd et al. ............... 365/225.7 |
| 5,991,220 A | | 11/1999 | Freyman et al. ......... 365/225.7 |
| 6,006,169 A | | 12/1999 | Sandhu et al. ............... 702/132 |
| 6,041,007 A | * | 3/2000 | Roeckner ................. 365/225.7 |
| 6,108,804 A | * | 8/2000 | Derner ........................ 714/721 |

* cited by examiner

Primary Examiner—Richard Elms
Assistant Examiner—Anh Phung
(74) Attorney, Agent, or Firm—Duane Morris & Heckscher LLP; Steven E. Koffs

(57) ABSTRACT

An integrated circuit has a circuit that is capable of being trimmed. A plurality of fuse links are connectable to the circuit for trimming the circuit. Each fuse link has a fuse and provides an output signal. A register has a first bit that is set to enable a test function, and a plurality of additional test data bits that provide the test output signal. A plurality of switches, which may be multiplexers, select either the output signals of the fuse links or the test output signal, and output the select signals. Each multiplexer has a first data input connected to a respective one of the plurality of fuse links. Each multiplexer has a second data input connected to a respective test data bit of the register. Each multiplexer has a select input connected to the first bit of the register.

8 Claims, 2 Drawing Sheets

100

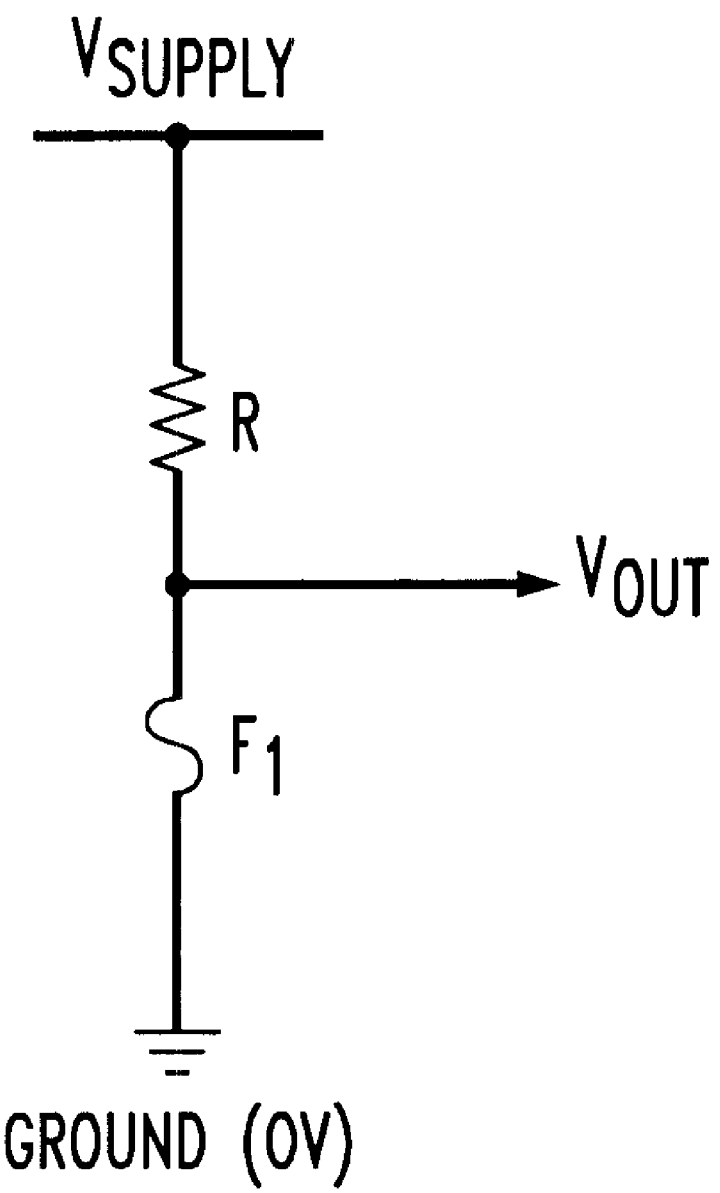

SEMICONDUCTOR DEVICE WITH TEST FUSE LINKS, AND METHOD OF USING THE TEST FUSE LINKS

FIELD OF THE INVENTION

The present invention relates to fabrication of semiconductor integrated circuits.

DESCRIPTION OF THE RELATED ART

In an application in which trimming of precise circuit characteristics is necessary, fuse links are commonly placed on integrated circuit (IC) chips. A pre-determined algorithm based upon the circuit's behavior under nominal processing conditions is used to determine the appropriate fuse links to be "blown" or opened to adjust the circuit parameters accordingly.

For example, U.S. Pat. No. 5,991,220 to Freyman et al., which is expressly incorporated by reference herein in it entirety, describes an apparatus for selectively controlling a plurality of fuses associated with an IC. Each fuse is switchable from a closed state to an open state. The apparatus has a data register including an array of internal registers. Each of the internal registers is coupled with one of the fuses. Each internal register is identified by an address and is separately addressable. An instruction register contains instructions for determining whether the fuses are to assume the opened state or the closed state. A controller connects the data register and the instruction register. The controller combines with the data register to cause the fuses associated with the internal registers to assume the states determined by the instruction register.

The predetermined trim algorithm works well under ideal conditions. However, in a real production environment, the circuit behavior may differ greatly from the nominal process upon which the trim algorithm is based. The net result is that over large populations of devices, the tolerances of parameters which depend upon fuse link trimming are influenced not only by the resolution of the finest trim step, but also by the tracking of the expected trim algorithm to the actual component behavior This method can also negatively effect product yield if the incorrect fuse links are chosen for a particular device. In the case of traditional metal fuse links, where the fuse is blown by passing a large current, once the fuse is blown, there is no chance to correct for an improper decision.

SUMMARY OF THE INVENTION

One aspect of the present invention is a test function for an integrated circuit including a circuit that is capable of being trimmed. A storage device provides a test output signal. A switch selects either the output signal of the fuse link or the test output signal, and outputs the selected signal to the circuit to be trimmed.

Another aspect of the invention is a method for trimming a circuit on an integrated circuit (IC) chip, including at least one fuse link having a fuse. The method includes testing the circuit to be trimmed, to obtain first test results with the fuse intact. A test circuit on the IC is enabled. The test circuit provides substantially the same input to the circuit as provided by a linked circuit that is formed if the fuse is blown. The circuit is tested to obtain second test results with the test circuit enabled the first and second test results are compared to predetermined desired values. The fuse is blown, if the second test results are closer to the desired values than the first test results.

BRIEF DESCRIPTION OF THE DRAWINGS

FIG. 2 is a schematic diagram of a first exemplary embodiment of the fuse sense circuit of FIG. 1.

DETAILED DESCRIPTION

Figure 1:
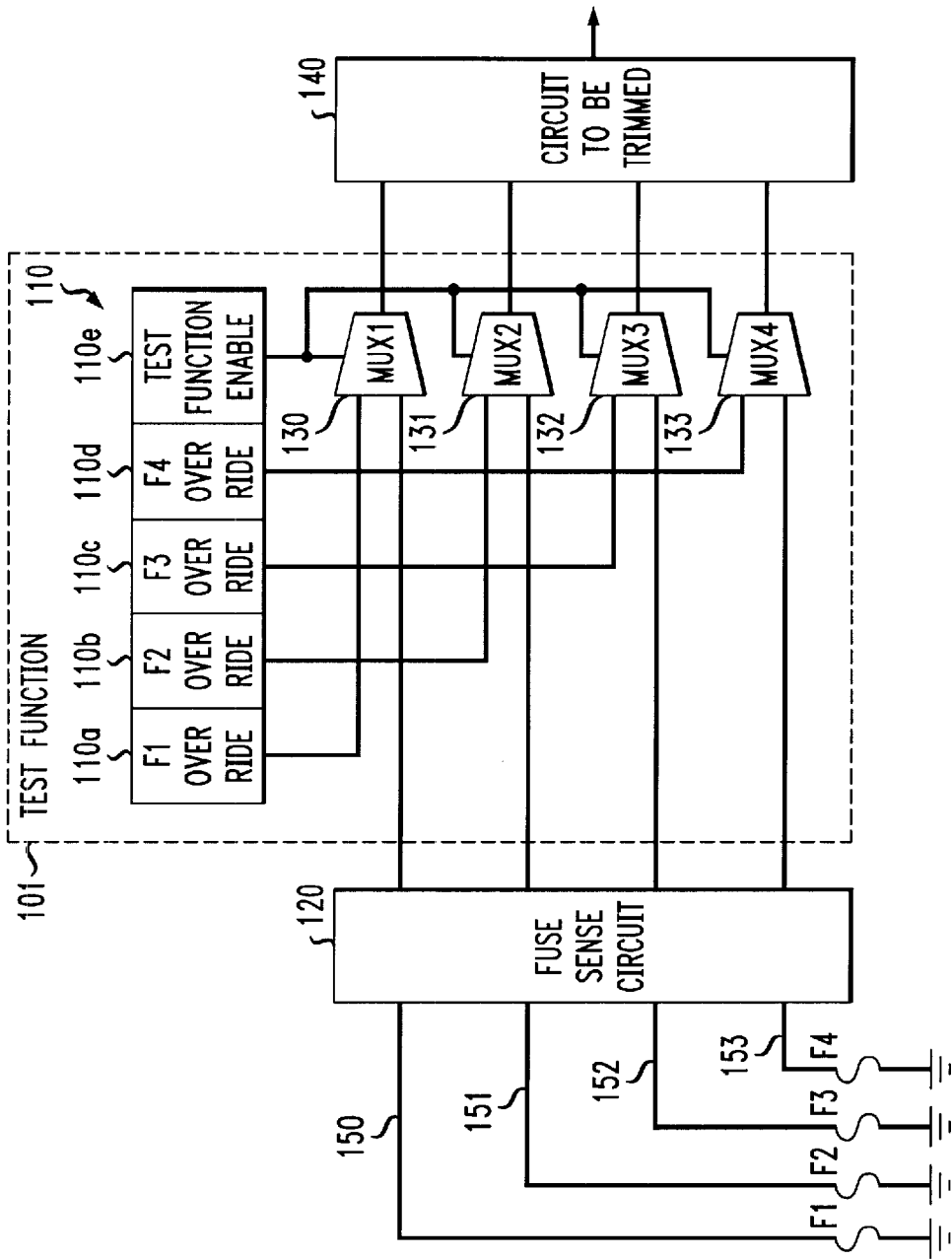
FIG. 1 is a block diagram of exemplary circuitry including a set of register overwriteable fuse links.

The present invention provides a method and apparatus for trimming circuits. The trimming operation is typically done on the wafer at a particular temperature and operating condition. For example, in the case of a voltage reference, it is desirable to be able to trim that voltage reference to a precise value once and thereafter have that voltage value remain the same. It would be undesirable to go back and change the trimming subsequently. However, the predetermined algorithms that are used to do the trimming may not work in all processing variations or cases. The vast majority of variations that occur in a processing line result in some of the devices being trimmed too far because the trim algorithms are based on nominal cases.

One aspect of the present invention is a method by which, during the trimming process, instead of blowing the trimming fuses, it is possible to enable a test function for example, by flipping a test function enable bit in a register— allowing the tester to duplicate the function of blowing the real fuse links. This capability essentially allows the tester to test the function of blowing the links. The test can be repeated, while changing the complement of (simulated) blown fuse links in the test function. Once the tester finds the complement of (simulated) blown fuse links that produces the optimum value from the circuit to be trimmed, then the tester knows which of the real fuses to blow.

FIG. 1 is a schematic diagram of the circuitry on an IC chip 100 according to the present invention. IC 100 includes at least one circuit 140 that is capable of being trimmed. Preferably, circuit 140 is a circuit that requires a one-time precision adjustment, such as, but not limited to, a voltage reference circuit, a bandgap reference, or a data converter. Preferably each IC chip 100 on a wafer (not shown) includes at least one of the test functions 101, and more preferably, a separate test function 101 is provided for each circuit 140 on the IC chip that is to be trimmed using fuse links.

At least one fuse link is connectable to the circuit 140, by way of a fuse sense circuit 120, for trimming the circuit 140. In the exemplary embodiment, four fuse links 150–153 are shown, each including a respective fuse F1–F4, and each providing an output signal. The circuit 140 is trimmed by selectively opening (blowing) one or more of the fuses F1–F4.

The fuse sense circuit 120 provides a logic high or logic low output value for each fuse link 150–153, depending on whether the respective fuses F1–F4 are closed (intact) or open (blown). Essentially, for each fuse link 150–153, the fuse sense circuit 120 tells whether or not there is a closed fuse present. For example, fuse sense circuit 120 may be configured to identify whether there is a large current or no current coming from the fuses F1–F4. The fuse sense circuit 120 is described in detail below, with reference to FIG. 2.

A storage device provides a test output signal. In the exemplary embodiment, the storage device is a register 110. The register 110 has an input (not shown) that allows it to be written by an external piece of equipment, such as a wafer probe testing machine. The register has at least two bits. The number of bits in the register 110 is one greater than the number of fuse links 150–153. In the example, register 110 has five bits 110a–110e. Each of the bits of the register 110 except for a first bit 110e outputs a data bit of the test output signal.

At least one switch is provided for selecting either the output signal of the fuse link 150–153 or the test output signal, and for outputting the selected signal. In the exemplary embodiment, there is a plurality of switches, more specifically four multiplexers 130–133. Preferably, the number of multiplexers is equal to the number of fuse links 150–153. Although the exemplary embodiment includes multiplexers 130–133, other conventional switching devices (e.g., transistors) may also be used.

The register 110 has a plurality of bits 110a–110e. The first bit 110e of register 100 is provided to the select input of each multiplexer 130–133. Each multiplexer 130–133 has a first data input connected to a respective one of the plurality of fuse links 150–153. Each multiplexer 130–133 has a second data input connected to a respective test data bit 110a–110d of the register 110. The remaining bits 110a–110d provide the test output signal to the respective data inputs of the plurality of multiplexers 130–133. The fuse sense circuit 120 provides the output signal of the fuse links 150–153 to the multiplexers 130–133.

Although the exemplary storage device is a register 110, the storage function may also be performed using other conventional components (e.g., latches, flip-flops and the like) that are capable of holding the state of a logic signal.

Another aspect of the present invention is a method for trimming an integrated circuit (IC) 100 including at least one fuse link 150–153 having a fuse F1–F4. There are a variety of possible variations of the method that may be performed using the circuitry 101 shown in FIG. 1. The invention allows testing the IC 100 to obtain test results with all the fuses F1–F4 closed (intact). Preferably, the testing and trim operation is done before the IC chips 100 are separated from the wafer, at the wafer probe stage.

In a simplified first variation of the exemplary method, one can consider a configuration having only one fuse F1, one multiplexer 130 and one override bit 110a. (These elements are as shown in FIG. 1 if the other fuses F2–F4, multiplexers 131–133 and override bits 110b–110d are ignored). The circuit 140 is first tested to obtain first test results with the fuse F1 intact. The fuse link 150 is switched out and the test circuit 101 on the IC 100 is enabled by flipping test function enable bit 110e. This provides a test function enable signal to a select input of the multiplexer 130, to provide substantially the same input to the circuit 140 as provided by a linked circuit (e.g., 150) that is formed if the fuse F1 is blown. The circuit 140 is then tested to obtain second test results with the test circuit enabled. The output of circuit 140 from the first and second test results are compared to the predetermined desired value of the circuit 140. Then, the test circuit 101 is switched out and the fused link is enabled. The fuse F1 is blown, if the second test results are closer to the desired values than the first test results, and the fuse F1 is left intact, if the first test results are closer to the desired values than the second test results.

A second variation of the exemplary method may be used for trimming the circuit 140 of FIG. 1, including a plurality of fuse links 150–153, each having a fuse F1–F4. To initiate the test, the tester enables the test circuit 101 on the IC 100 by setting the contents of register 110. The first bit 110e is set to its enabled value (e.g., a "1"), and the other bits are set to a first approximation of the optimal trim value. For example, the first approximation may comprise values of the bits that would be produced by the conventional trim algorithm, based on the fabrication conditions.

When the test function enable bit 110e is set, this causes the multiplexers 130–133 to select the test output signal from register bits 110a–110d. The test circuit 101 is thus set to provide a first input to the Circuit 140, corresponding to a first configuration of fuses F1–F4 that are either closed (intact) or open (blown). The circuit 140 is tested to obtain first test results with the fuses F1–F4 intact. The first test results are compared to a set of predetermined desired values. The test function enable bit 110e is reset, causing the multiplexers 130–133 to select the output signal from the actual fuse links 150–153. Anywhere from zero to all of the fuses F1–F4 are then blown, to match the first configuration of fuses, if the first test results match the predetermined values within a predetermined tolerance. The tolerance is set so that the device is commercially usable.

If the initial approximation does not produce an acceptable output from the circuit 140, then another configuration of test register bits 110a–110d may be written to the register 110, and the test can be repeated, until the output of the circuit 140 falls within the predetermined tolerance.

For example, if the circuit 140 is a voltage reference, then the fuses can be blown to match the first configuration of fuses, if they provide an acceptable voltage. Although this variation may not always produce the best possible trim values, it can provide an acceptable value in a shorter time than conducting multiple tests.

In a third variation of the exemplary method, the IC is tested with a plurality of different complements of the override bits 110a–110d set to the logic value that corresponds to an open (blown) fuse to obtain multiple sets of test results with the test circuit 101 enabled.

The test circuit 101 on the IC 100 is enabled. The test circuit 101 is set to provide a first input to the circuit 140, corresponding to a first configuration of fuses F1–F4 that are either intact or blown. The circuit 140 is tested to obtain first test results (while the real fuses F1–F4 are all intact). The test circuit 101 is then set to provide a second input to the circuit 140, corresponding to a second configuration of fuses F1–F4 that are either intact or blown, the second configuration differing from the first configuration. This is accomplished by writing a different set of data into bits 110a–110d of register 110, while keeping the test function enable bit 110e set to "1".

The circuit 140 is then tested to obtain second test results with the fuses intact. For example, in addition to the first approximation provided by the conventional trim algorithm, the circuit 140 may be tested using the closest higher and closest lower values in register 110. The first and second test results are compared to a predetermined desired value. If the closest lower value provides a better result (i.e., is closer to a predetermined desired value), then the second closest lower value is tested, and the results from the closest lower value and the second closest lower value are compared to see which is closer to the predetermined desired value. Similarly, if the closest higher value provides a better result (i.e., is closer to a predetermined desired value), then the second closest higher value is tested. Successive lower or higher values are tested and compared to the desired value, until the results begin to worsen (i.e., move further from the desired value). Then the value that produces the optimal result for the conditions under which the device was fabricated is known.

More generally, testing may be performed using any register configurations corresponding to any two or more (or all) possible configurations of the fuses F1–F4, and these tests may be conducted in any order. Any two or more (or all) of these test results may be compared to the predetermined desired value, and the configuration of fuses yielding the test results closest to the desired values is chosen. Thus, any "first" and "second" configurations from the set of all possible configurations of the fuse array may be tested using the test function 101.

Having completed the testing, the test function enable bit 110 is reset to "0", so that the multiplexers 130–133 output the values of the actual fuse links 150–153. Then the conventional fuse blowing circuitry (such as that set forth in U.S. Pat. No. 5,991,220) is used to selectively blow the appropriate fuses, to match the one of the first and second configurations that provides results closer to the predetermined desired values.

FIG. 2 shows an exemplary fuse sense circuit 120. The fuse sense circuit 120 may include a resistor R between the fuse F1 and a supply voltage $V_{supply}$, and the output of the fuse sense circuit provides a voltage $V_{out}$ at a node between the fuse F1 and the resistor R. An identical circuit is included for each fuse link 150–153.

Other fuse sense circuits may also be used. For example, common-gate amplifiers may be used to sense the state of the trim link and amplify the signal (which may be a low level signal in a low resistance link) into a valid logic state for use by subsequent latching or logic. The sense amplifiers are DC biased and designed with sufficient gain and offset tolerance to amplify a worst case minimum resistance.

Although the exemplary method described above may be performed manually, the method is preferably automated. For example, the external test equipment (not shown) may be programmed to input all possible combinations of values into register 110, and repeat the testing of circuit 140 with each possible configuration of the fuse test bits. Once all of the iterations are completed, the software can select the fuse configuration that produces the best result from circuit 140 (i.e., most closely matches the nominal output). The actual fuses are then selectively blown to match the optimum configuration determined by the testing using, for example, the system of U.S. Pat. No. 5,991,220. Other algorithms described above for deciding which configurations of test bits to use may also be implemented in software, and automatically performed.

Alternatively, feedback logic may be built into the IC chip 100 itself. The feedback loop (not shown) would sense the output of the circuit 140. An analog to digital converter may be used to convert an analogue output of circuit 140 to a digital output. The digital output is processed through software control, built on the chip 100.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. Test apparatus for an integrated circuit having, the test apparatus comprising:
   a plurality of fuse links, wherein a circuit is trimmed by blowing at least one fuse, the fuse links providing output signals;
   a register that provides test output signals, the register having a plurality of test data bits that include a first bit that provides a selection signal and a plurality of second bits that provide the test output signals; and
   a plurality of multiplexers, each selecting either the output signal of one of the fuse links or a corresponding one of the test output signals, and for outputting the selected signals to the circuit, each multiplexer having a first data input connected to a respective one of the plurality of fuse links, each multiplexer having a second data input connected to a respective test data bit of the register, each multiplexer having a select input connected to the first bit of the register.

2. The test apparatus of claim 1, wherein the number of multiplexers in the plurality of multiplexers is the same as the number of fuse links in the plurality of fuse links.

3. The test apparatus of claim 1, wherein the number of multiplexers in the plurality of multiplexers is the same as the number of second data bits in the register.

4. The test apparatus of claim 1, wherein the number of bits in the register is one more than the number of fuse links in the plurality of fuse links.

5. An integrated circuit, comprising:
   a circuit that is capable of being trimmed;
   a plurality of fuse links connectable to the circuit for trimming the circuit, each fuse link having a fuse and providing an output signal;
   a register that provides test output signals and has a plurality of test data bits including a first bit that provides a selection signal and a plurality of second bits that provide the test output signals; and
   a plurality of multiplexers, each selecting either the output signal of one of the fuse links or a corresponding one of the test output signals, and for outputting the selected signal to the circuit, each multiplexer having a first data input connected to a respective one of the plurality of fuse links, each multiplexer having a second data input connected to a respective test data bit of the register, each multiplexer having a select input connected to the first bit of the register.

6. The integrated circuit of claim 5, wherein the number of multiplexers in the plurality of multiplexers is the same as the number of fuse links in the plurality of fuse links.

7. The integrated circuit of claim 5, wherein the number of multiplexers in the plurality of multiplexers is the same as the number of second data bits in the register.

8. The integrated circuit of claim 5, wherein the number of bits in the register is one more than the number of fuse links in the plurality of fuse links.

* * * * *